(12) United States Patent
Willis et al.

(10) Patent No.: US 8,994,434 B2
(45) Date of Patent: Mar. 31, 2015

(54) COINCIDENT TRACKING TURN-ON FOR MIXED VOLTAGE LOGIC

(71) Applicant: BAE Systems Information and Electronic Systems Integration Inc., Nashua, NH (US)

(72) Inventors: Scott C. Willis, Fairfax Station, VA (US); William C. Singleton, Manassas, VA (US); Russell Buchanan, Arlington, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 13/765,094

(22) Filed: Feb. 12, 2013

(65) Prior Publication Data

US 2013/0207713 A1 Aug. 15, 2013

Related U.S. Application Data

(60) Provisional application No. 61/597,999, filed on Feb. 13, 2012.

(51) Int. Cl.
*H03L 5/00* (2006.01)
*H03K 5/08* (2006.01)
*H03K 17/081* (2006.01)

(52) U.S. Cl.
CPC ............................... *H03K 17/08104* (2013.01)
USPC ......................................... 327/309; 327/306

(58) Field of Classification Search
CPC ... H03K 5/08; H03K 17/0822; H03G 11/002; H03G 11/02; H03G 11/06
USPC .......... 327/306, 309–330; 323/265, 266, 268, 323/271, 282, 283, 285–287
See application file for complete search history.

(56) References Cited

U.S. PATENT DOCUMENTS

| | | | |
|---|---|---|---|
| 6,236,250 B1 | 5/2001 | Salmon et al. | |
| 6,909,204 B2 | 6/2005 | Batey | |
| 7,368,898 B2 * | 5/2008 | Sutardja et al. | ............... 323/285 |
| 2006/0022653 A1 * | 2/2006 | Reed et al. | .................... 323/282 |

* cited by examiner

*Primary Examiner* — Diana J Cheng
(74) *Attorney, Agent, or Firm* — Daniel J. Long

(57) ABSTRACT

A method for dealing with high inrush current when voltage is applied to mixed voltage logic integrated circuits is disclosed. A depletion N-Channel Metal Oxide Semiconductor Field Effect Transistor (MOSFET) or junction Field Effect Transistor (JFET) is added to a linear voltage regulator in mixed voltage logic integrated circuits. The Field Effect Transistor (FET) is utilized to allow the core voltage to come up with Input/Output voltage prior to turn-on of linear voltage regulator. Turn-on state of FET allows the core voltage to rise with Input/Output voltage until the FET threshold is reached across the gate. When threshold is reached, the FET turns off to allow linear voltage regulator turn on and take over supply power.

6 Claims, 4 Drawing Sheets

COINCIDENT TRACKING TURN-ON FOR MIXED VOLTAGE LOGIC

STATEMENT OF GOVERNMENT INTEREST

This invention was made with United States Government support under Contract No. NNG10CR08C awarded by the National Aeronautics and Space Administration. The United States Government has certain rights in this invention.

CROSS-REFERENCE TO RELATED APPLICATIONS

This application claims rights under 35 USC §119(e) from U.S. Application Ser. No. 61/597,999 filed 13 Feb. 2012, the contents of which are incorporated herein by reference.

TECHNICAL FIELD

Embodiments are generally related to Integrated Circuits (ICs). Embodiments are also related to mixed voltage logic ICs. Embodiments are additionally related to methods dealing high inrush current when voltage is applied to mixed voltage logic ICs. Embodiments are also additionally related to coincident tracking turn-on for mixed voltage logic.

BACKGROUND OF THE INVENTION

Electronic systems employing analog circuitry along with microprocessors, DSPs, ASICs, and FPGAs has many different power supply rails. The on-off timing, rise and fall rate, order of application, and magnitude of each of the supply voltages needs to be controlled for reliable, repeatable operation. Power system design includes supply sequencing, supply tracking, supply voltage/current monitoring and control. A variety of power management ICs exists to perform the functions of sequencing, tracking, and monitoring for both power-up and power-down.

Power supply tracking is based on the fact that power supplies cannot provide instantaneous changes in their voltage; this can be used advantageously by power system designers in controlling the slew rate of each of the various supplies in relation to other supplies in the system.

Power supply tracking systems handle a variety of power-up profiles to satisfy the requirements of digital logic circuits including FPGAs, PLDs, DSPs and microprocessors. Some applications require that the potential difference between two power supplies must never exceed a specified voltage. This requirement applies during power-up and power-down as well as during steady-state operation, often to prevent destructive latch-up in a dual supply ASIC. Typically, this result is achieved by ramping the supplies up and down together. In other applications it is desirable to have the supplies ramp up and down with fixed voltage offsets between them or to have them ramp up and down ratiometrically.

During turn-on of dual voltage ICs, circuits powered by Input/Output (IO) voltage can be in state that draws excessive current because core voltage is below minimum voltage to ensure logic is in proper state. This condition may create a problem in some circumstances when supplies did not have the capability to provide this large current, and consequently would not become operational. Typically boards are provided which have limited available voltages (lower voltages must be generated on-card), which limits options on controlling sequencing.

Heretofore it has been necessary to provide oversized power systems, or to add complex circuitry which requires the availability of board space and proper voltages for biasing.

A need, therefore exists for an improved way to deal with a high inrush current when voltage is applied to mixed voltage logic.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide an improved Integrated Circuits (ICs).

It is another aspect of the disclosed embodiments to provide an improved mixed voltage logic ICs.

It is further aspect of the disclosed embodiments to provide an improved method to deal high inrush current when voltage is applied to mixed voltage logic ICs.

It is yet further aspect of the disclosed embodiments to provide an improved method for coincident tracking turn-on for mixed voltage logic.

The aforementioned aspects and other objectives and advantages can now be achieved as described herein. A method for dealing with high inrush current when voltage is applied to mixed voltage logic integrated circuits is disclosed. A depletion N-Channel MOSFET or junction FET is added to a linear voltage regulator in mixed voltage logic integrated circuits. The FET is utilized to allow the core voltage to come up with Input/output voltage prior to turn-on of linear voltage regulator. Turn-on state of FET allows the core voltage to rise with Input/Output voltage until the FET threshold is reached across the gate. When threshold is reached, the FET turns off to allow linear voltage regulator turn on and take over supply power.

The present invention provides a compact solution which is effectively out of circuit during normal operation, so previous analysis and testing are still valid. Furthermore this solution has higher power efficiency since normal power does not pass through an isolate switch for Input/Output voltage. It will also be appreciated that the invention also allows core voltage to immediately rise with Input/Output voltage and is only limited by the FET device resistance which can be scaled to any desired value by device selection and/or paralleling.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

The particular values and configurations discussed in these non-limiting examples can be varied and are cited merely to illustrate at least one embodiment and are not intended to limit the scope thereof.

The embodiments now will be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 1:
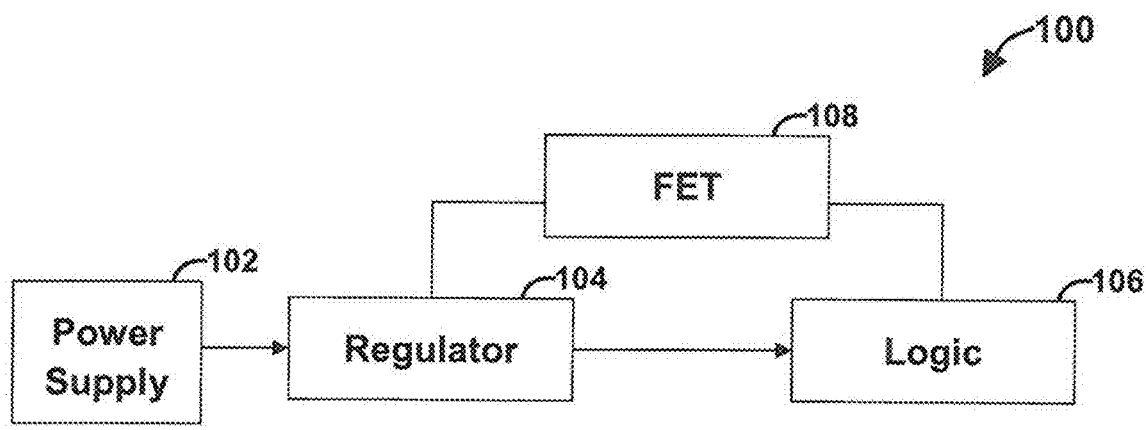
FIG. 1 illustrates a block diagram of a device utilized for coincident tracking turn on of mixed voltage logic, in accordance with the disclosed embodiments.

FIG. 1 illustrates a block diagram of a device 100 utilized for coincident tracking turn on of mixed voltage logic 106, in accordance with the disclosed embodiments. A FET 108 is used to allow core voltage to come up with Input/Output voltage prior to turn on of linear voltage regulator 104. FET 108 is normally on, allowing core voltage to rise with Input/Output voltage during turn-on, until the threshold of FET 108 is reached across the gate, at which point the FET 108 turns off and the linear regulator 104 has sufficient voltage for it to turn-on and take over supply power 102. Note that the device 100 can be mixed voltage logic ICs for example dual voltage logic ICs.

Figure 2:
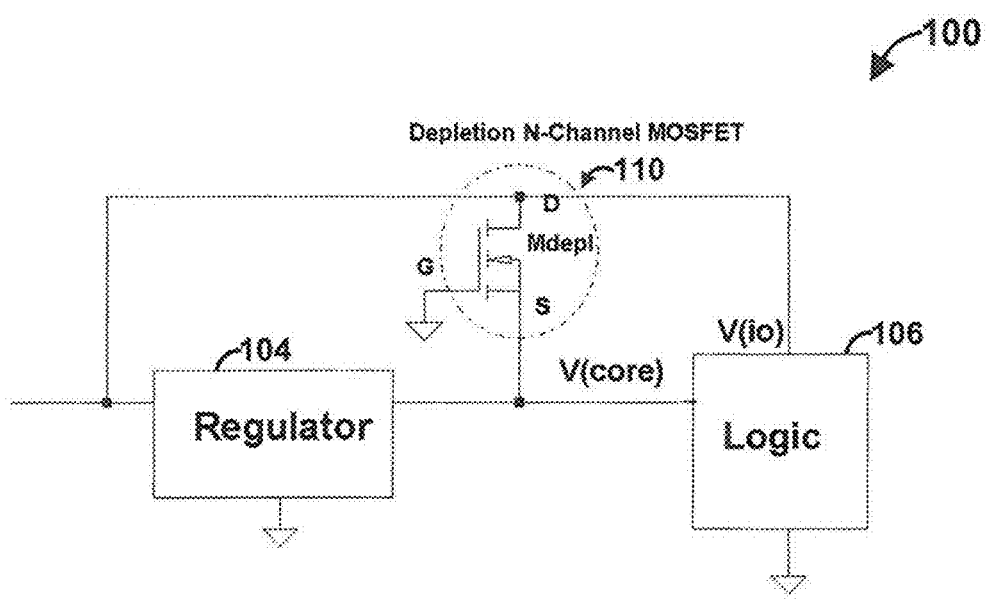
FIG. 2 illustrates a schematic diagram of the device depicted in FIG. 1, in accordance with the disclosed embodiments.

Referring to FIG. 2, the schematic diagram of the device 100 depicted in FIG. 1 is shown. A FET 104 depicted in FIG. 1 can be a Junction FET or a MOSFET. In FIG. 2, a depletion N-channel MOSFET 110 is utilized for coincident tracking turn on of mixed voltage logic 106. Turn-on state of depletion N-channel MOSFET 110 allows the core voltage to rise with Input/Output voltage until the depletion N-channel MOSFET 110 threshold is reached across the gate. When threshold is reached, the depletion N-channel MOSFET 110 turns off to allow linear voltage regulator 104 turn on and take over supply power. Note that in FIG. 2, the source, drain and gate of the depletion N-channel MOSFET 110 are denoted as S, D and G respectively.

The MOSFET characteristics for device selection are as follows:

$$V(core)min < |Vt| < V(core)nom$$

where V(core) min represents minimum core voltage, $V_t$ represents threshold voltage of the depletion N-channel MOSFET and V(core) nom represents normal core voltage. Low drain source resistance is sufficient to charge core voltage load capacitance at same rate as Input/Output voltage.

Figure 3:
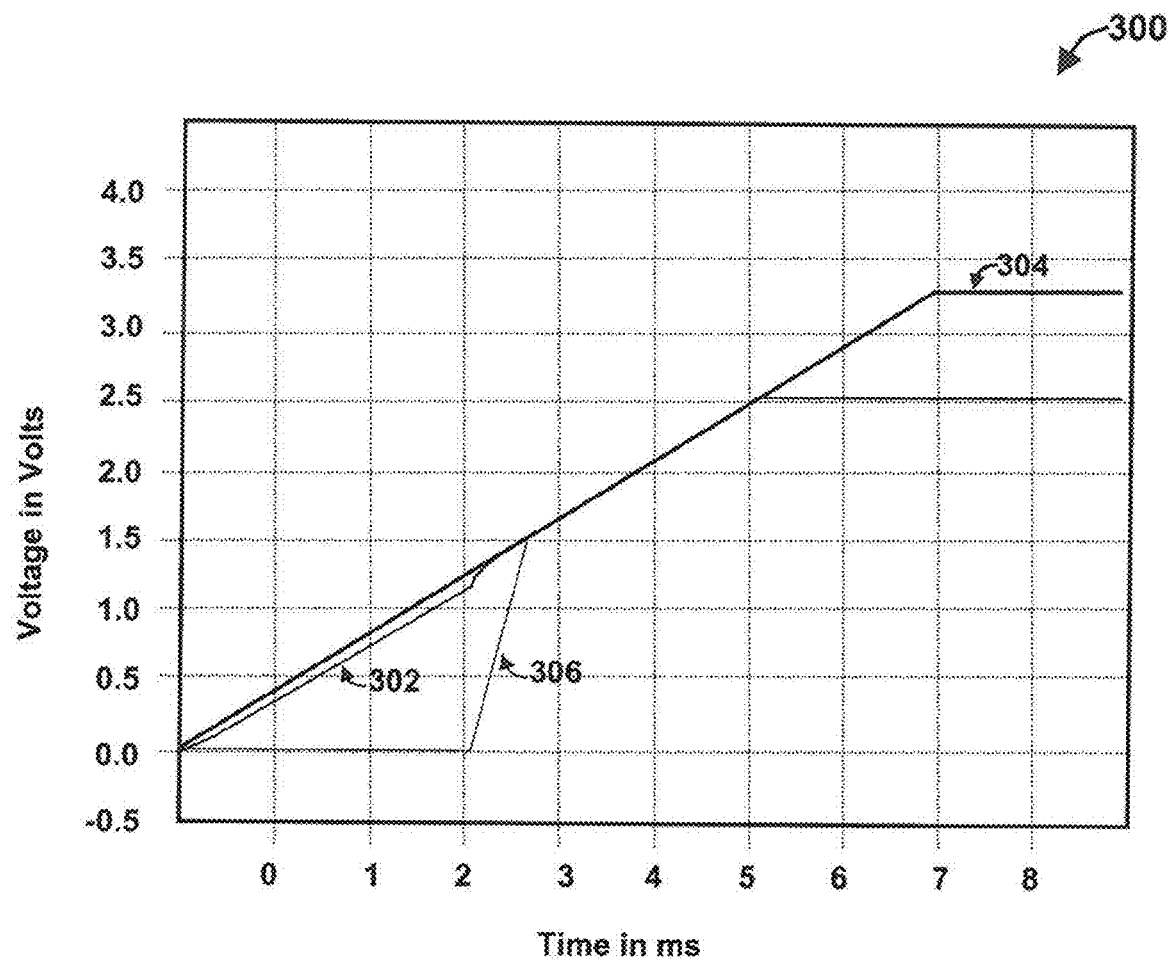
FIG. 3 illustrates a graph with waveforms showing how core voltage ramps up coincident with Input/Output voltage, in accordance with the disclosed embodiments.

Referring to FIG. 3, a graph 300 with waveforms 302, 304 and 306 shows how core voltage ramps up coincident with Input/Output voltage. In accordance with the disclosed embodiments, the waveforms 302 and 304 represent variation of core voltage and variation of Input/output voltage with respect to time respectively, by adding a FET to a regulator in mixed voltage logic ICs. The waveform 306 shows variation of core voltage without FET in mixed voltage logic ICs. As shown in FIG. 3, coincident tracking, the waveforms 302 and 304 rise at the same rate and finish at different times.

Figure 4:
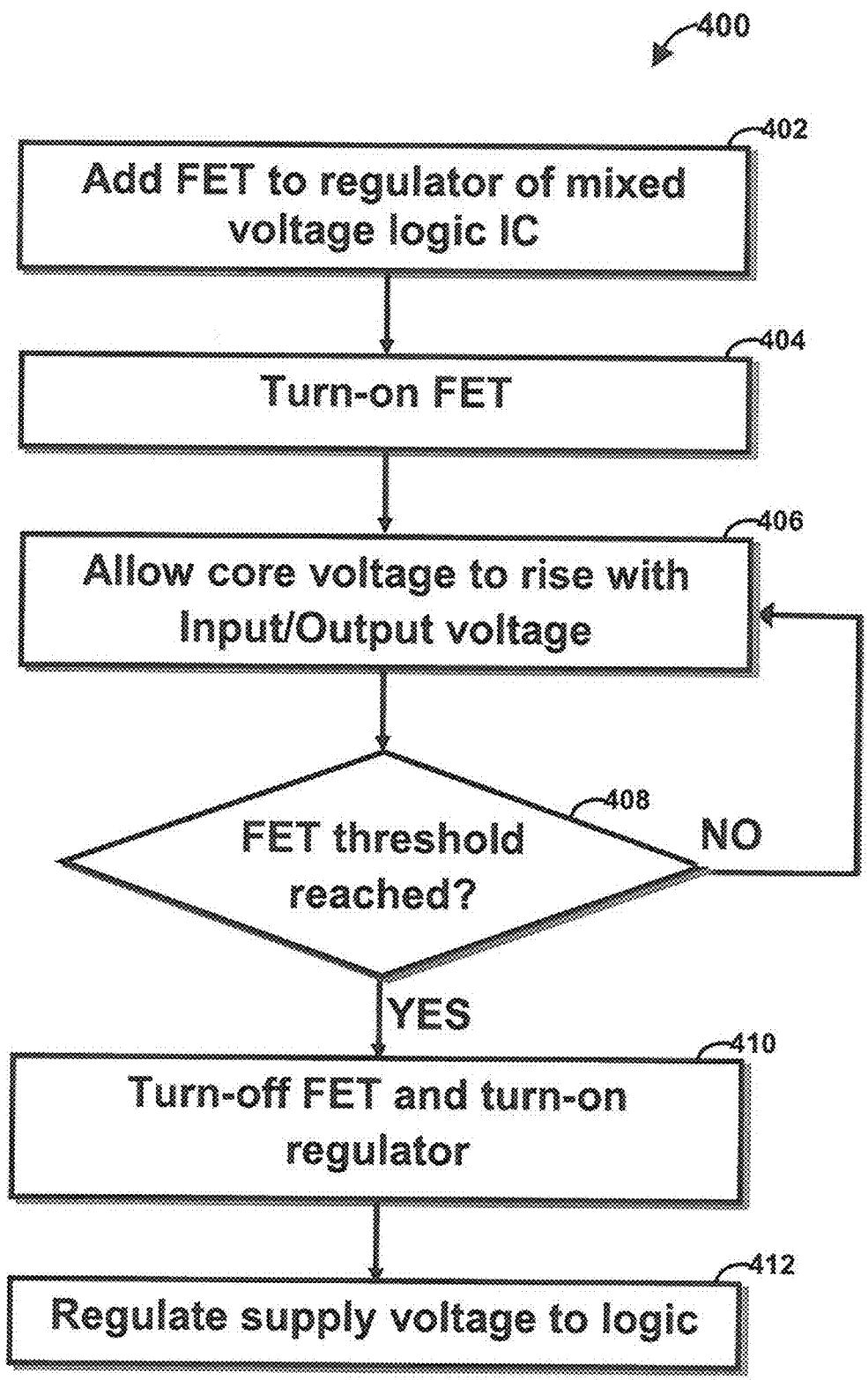

FIG. 4 illustrates a flow chart 400 depicting the process of dealing high inrush current when voltage is applied to mixed voltage logic integrated circuits, in accordance with the disclosed embodiments. As said at block 402, a depletion N-Channel MOSFET or junction FET is added to a linear voltage regulator in mixed voltage logic integrated circuits. As depicted at blocks 404 and 406, the FET turns on and is utilized to allow the core voltage to come up with Input/Output voltage prior to turn-on of linear voltage regulator. Turn-on state of FET allows the core voltage to rise with Input/Output voltage until the FET threshold is reached across the gate as said at block 408. When threshold is reached, as depicted at block 410, the FET turns off to allow linear voltage regulator turn on and take over supply power. Finally, the supply voltage to mixed voltage logic is regulated as said at block 412.

Those skilled in the art will appreciate that the following variations would be possible. For example, multiple FETs could be placed in parallel to increase capacity and lower effective resistance. Junction FET would be used instead of MOSFET. For lower core voltages, bias could also be generated by a charge pump or similar circuit.

Those skilled in the art will also appreciated that the present invention provides a compact solution which is effectively out of circuit during normal operation, so previous analysis and testing are still valid. Furthermore, this solution has higher power efficiency since normal power does not pass through an isolate switch for Input/Output voltage. It will also be appreciated that the invention also allows core voltage to immediately rise with Input/Output voltage and is only limited by the FET device resistance which can be scaled to any desired value by device selection and/or paralleling.

While the present invention has been described in connection with the preferred embodiments of the various figures, it is to be understood that other similar embodiments may be used modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A method of dealing high inrush current on applying voltage to a mixed voltage logic integrated circuits comprising:

adding only a single Field Effect Transistor to a linear voltage regulator of said mixed voltage logic integrated circuits, wherein the single Field Effect Transistor and the linear voltage regulator operate only on a single supply power; and ramping up core voltage coincidentally with Input/Output voltage until a threshold of said linear voltage regulator is turned on to take over supply power on reaching the threshold voltage of said Field Effect Transistor and wherein minimum core voltage is less than the threshold voltage of the Field Effect Transistor and the threshold voltage of the Field Effect Transistor is less than the normal core voltage.

2. The method of claim 1, wherein said Field Effect Transistor comprises a Junction Field Effect Transistor.

3. The method of claim 1, wherein said Field Effect Transistor comprises a Metal Oxide Semiconductor Field Effect Transistor.

4. A system for dealing high inrush current on applying voltage to a mixed voltage logic integrated circuits comprising:

only a single Field Effect Transistor to a linear voltage regulator of said mixed voltage logic integrated circuit to ramp up core voltage coincidentally with Input/Output voltage until a threshold of said Field Effect Transistor is reached, wherein the single Field Effect Transistor and the linear voltage regulator operate only on a single supply power and said Field Effect Transistor is automatically turned off and said linear voltage regulator is turned on to take over supply power on reaching the threshold voltage of said Field Effect Transistor and wherein minimum core voltage is less than the threshold voltage of the Field Effect Transistor and the threshold voltage of the Field Effect Transistor is less than the normal core voltage.

5. The system of claim 4, wherein said Field Effect Transistor comprises a Junction Field Effect Transistor.

6. The system of claim 4, wherein said Field Effect Transistor comprises a Metal Oxide Semiconductor Field Effect Transistor.

* * * * *